(12) United States Patent
Bischof et al.

(10) Patent No.: US 7,091,256 B2
(45) Date of Patent: Aug. 15, 2006

(54) REACTIVE THERMALLY-CURING AND/OR RADIATION-CURING PAINTS AND THEIR CURING METHODS

(75) Inventors: Markus Bischof, Warthausen (DE); Elisabeth Gemmler, Ulm (DE); Fritz Mezger, Schoenaich (DE); Thomas Raith, Wernau (DE); Christoph Ruechardt, Stegen (DE)

(73) Assignee: DaimlerChrysler AG, Stuttgart (DE)

( * ) Notice: Subject to any disclaimer, the term of this patent is extended or adjusted under 35 U.S.C. 154(b) by 41 days.

(21) Appl. No.: 10/873,717

(22) Filed: Jun. 22, 2004

(65) Prior Publication Data

US 2005/0020711 A1    Jan. 27, 2005

(30) Foreign Application Priority Data

Jun. 25, 2003  (DE) ................. 103 28 474
Oct. 2, 2003  (DE) ................. 103 45 903

(51) Int. Cl.
*C09D 133/08*  (2006.01)
*C09J 133/10*  (2006.01)
*C08F 2/46*  (2006.01)

(52) U.S. Cl. ............... 522/8; 522/12; 522/26; 522/28; 522/18; 522/96; 522/173; 526/312; 526/310

(58) Field of Classification Search .......... 522/8, 522/12, 173; 526/312
See application file for complete search history.

(56) References Cited

U.S. PATENT DOCUMENTS 4,702,997 A * 10/1987 Ai et al. ................... 430/325
5,492,731 A *  2/1996 Temple et al. ............ 427/407.1
5,635,544 A *  6/1997 Tamura et al. ............... 522/79
6,333,077 B1 * 12/2001 Maag et al. ............... 427/496

FOREIGN PATENT DOCUMENTS

EP  0 540 884  6/1995
EP  0 247 563  8/1995

\* cited by examiner

*Primary Examiner*—Susan Berman
(74) *Attorney, Agent, or Firm*—Davidson, Davidson & Kappel, LLC

(57) ABSTRACT

A reactive paint to be completely cured in air with binders that bear ethylenically-unsaturated groups, that can be cured by radical polymerization either thermally or both thermally and by UV light or high-energy radiation in a dual-cure method. The paint contains a combined initiator system consisting of thermal initiators and UV initiators and reactive oligomers that are formed from addition compounds of a reactant of formula (4)

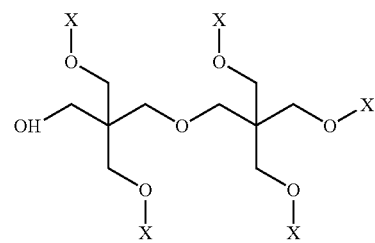

and a reactant of formula (5)

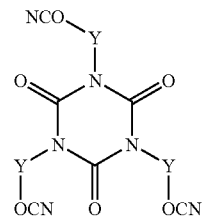

In this formula, $X = -CO-CH=CH_2$ or $-C_nH_m$ or $-CO-C_nH_m$. $-C_nH_m$ is an aliphatic residue with 1 to 3 C atoms, whereby 0, 1, 2 or 3 X substituents are formed by $-C_nH_m$, and Y is a hydrocarbon chain of 3 to 8 atoms that can also contain heteroatoms. Also provided is a method for curing by radical polymerization. The polymerization is first started thermally under air and then is continued either thermally or photoinitiated under air or protective gas, and a use in paint systems, especially in automobile manufacturing or as a binder.

10 Claims, 1 Drawing Sheet

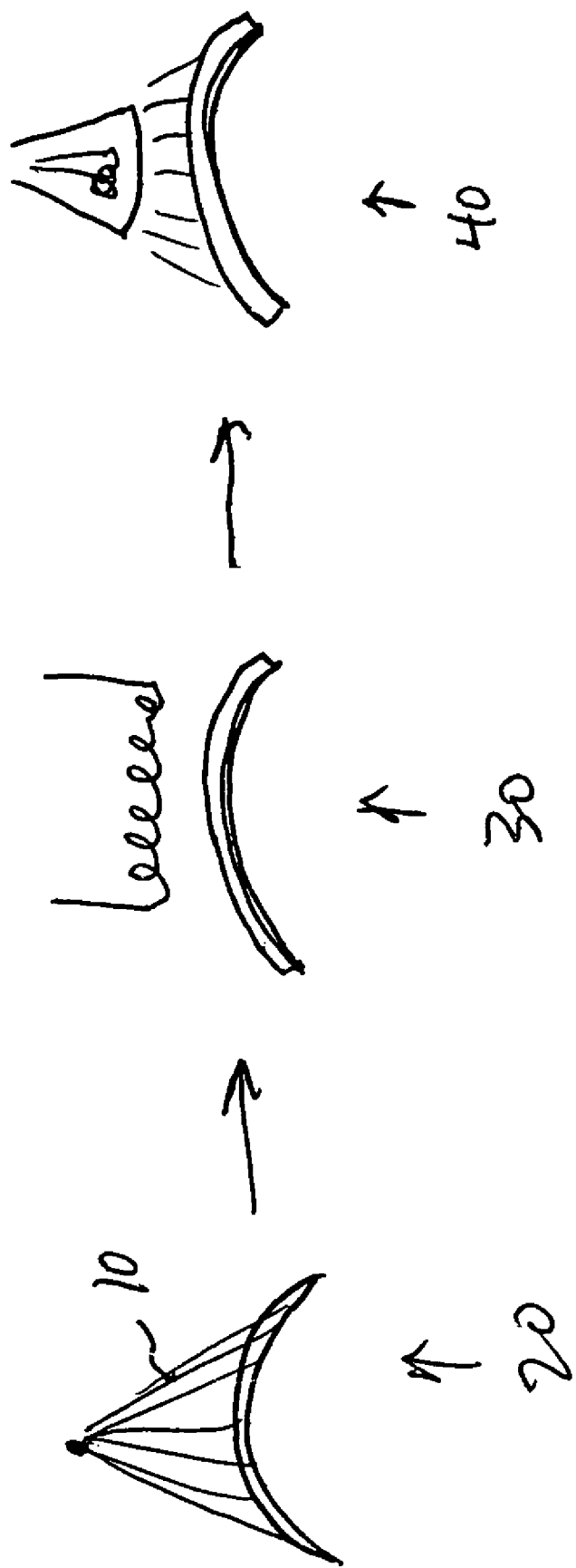

REACTIVE THERMALLY-CURING AND/OR RADIATION-CURING PAINTS AND THEIR CURING METHODS

This claims the benefit of German Patent Application No 103 28 474.5, filed Jun. 25, 2003, and German Patent Application No. 103 45 903.0, filed Oct. 2, 2003, both of which are hereby incorporated by reference herein.

BACKGROUND

The present invention relates to reactive thermally-curing and/or radiation-curing paints and their curing methods.

Most metallic and many plastic surfaces of articles for use are painted to prevent weathering and corrosion and for decorative reasons. This holds especially true in the automotive industry. Two-component polyurethane paints (2C-PUR) have become a standard technology since they cure at low temperatures and can be adjusted to flexibly adapt to the substrate. In addition, these systems are distinguished by satisfactory weather resistance.

Light-curing paints in particular assure qualitative improvements. Of these paints, UV-cured paints are the main ones that are used. Typical fields of application for such paint systems can be found in the electronics industry, printing, furniture, parquet flooring and paper industry.

Such paints contain binders having ethylenically-unsaturated groups which are suitable for polymerization (reactive groups). Frequently, acrylate or methacrylate groups are used as the reactive groups. The hardening reaction that can be started by photoinitiators of known paint systems is usually radical polymerization triggered by UV radiation.

Multilayer automobile coatings generally consist of a sequence of several functional layers that contain an anti-corrosion layer such as a phosphate coating, primer, a pigment-containing base coat and a final transparent clear coat.

The top paint layers generally consist of:
a base coat for providing color and setting the color effect (such as metallic), and
a clear coat as a protective layer against weathering, solvents and scratches.

The mechanical properties of the light-curing or UV-curing paint systems typically are better than those of conventional annealed enamels. It is very difficult to impossible to completely cure UV paints in shaded areas. This is particularly true of geometrically complex components where, depending on the application method such as dipping, spraying or spattering, the paint is applied or deposited in shaded areas.

Curable clear coats with binders based on poly(meth)acrylic functional compounds, polyisocyanate, light stabilizers and photoinitiators are known from European Patent Application No. 247 563 A1. The final hardness is achieved by additional cross-linking in which a part of the light-cross-linkable binders react via free hydroxyl groups with polyisocyanates to form urethanes. This combination of acrylate-containing monomers and acrylate-free monomers is disadvantageous to the paint quality.

European Patent Application No. 540 884 A1 includes a prior-art two-step method for producing a multilayer coating for automobiles. The paint formulation that is used in a final clear coat contains radically and/or cationically-curing binders. The hardening is started by UV radiation, and the final hardness is only attained in a second step. The second step is preferably annealing at temperatures of approximately 80–160° C. In one of the variations of the method, heat-activatable radical initiators are also used.

The known paint systems generally cannot meet the demands of high-quality automobile paints, or they cannot satisfactorily solve the problem of complete hardening in shaded areas. In particular, the paint quality is insufficient for hardening under air.

SUMMARY OF THE INVENTION

An object of the present invention is to present a radically polymerizable paint that can also harden in shaded areas whose quality is better even when the paint layers have access to air, and to provide a hardening method that allows hardening in shaded areas and improves the quality even when there is access to air, and to illustrate advantageous uses.

According to the present invention, a paint is provided with binders that bear ethylenically-unsaturated groups, whereby the paint can be hardened exclusively under heat or by a combination of radical polymerization initiated by heat and UV light or high-energy radiation, and whereby the paint contains a thermal or combined initiator system consisting of thermal initiators and UV initiators and reactive oligomers. According to the present invention, polyfunctional acrylate-modified isocyanurates obtainable by the reaction of a pentaerythritol derivative with an isocyanurate residue are among the reactive oligomers.

The paint is distinguished by its particularly high reactivity and low polymerization shrinkage. This is attained by a very reactive, radically polymerizable oligomer. The paint also contains other binders with ethylenically-unsaturated groups that are radically polymerizable. Suitable binders or binder systems are known, particularly from UV paint technology.

According to the present invention, the paint contains at least one thermal initiator system of organic azo compounds, organic peroxides, C-C-splitting initiators such as benzopinacol silyl ethers, N,N-diacyl hydroxyl amines, O-alkylated N,N-diacyl hydroxyl amines and/or O-acylated N,N-diacyl hydroxyl amines. Highly suitable azo compounds for use as thermal initiators include thermally labile substituted azo compounds such as azonitriles, cyclic and non-cyclic azoamides, azocumol or azocarboxylic acid esters. 2,2'-azobis (4-methoxy-2,4-dimethylvaleronitrile), 2,2'-azobis-(2,4,dimethylvaleronitrile), AIBN or dimethyl-2,2'-azobisisobutyrate are preferable. 4,4'-8 azobis-(4-cyanopentanoic acid) or their alkali salts are preferred polar solvents. In general, the storability of azo compounds is better than that of peroxides.

UV initiators can also be included as an additional initiator system. This produces a combined initiator system that can be hardened using a dual cure method. In a preferred embodiment of the invention, azo compounds that can be excited or split by UV light or high-energy radiation are also used. In a particularly preferred embodiment of this variation, the combination of thermal and UV starters is formed only by azo compounds.

Among the peroxo compounds suitable as thermal initiators are representatives of the different classes of peroxide compounds that have a low decomposition temperature, preferably with a half-life $t_{1/2}$ <1 hour at temperatures below 100° C. Preferred representatives are diacyl peroxides, peroxycarboxylic acid esters, peroxydicarbonates, perketals, dialkyl peroxides, peroxocarboxylic acids and their esters, ketone peroxides and/or hydroperoxides. Particularly preferred are di-(3,5,5-trimethylhexenoyl)peroxide, didecanoyl peroxide, dilauroyl peroxide, dibenzoyl peroxide, di-(2-ethylhexyl)peroxidicarbonate, dicyclohexylperoxodicarbonate, di-(4-tert.butyl cyclohexyl)peroxydicarbonate, dimryistyl peroxydicarbonate, diacetyl peroxydicarbonate, di-tert.butylperoxyoxalate, as well as peroxycarboxylic acid esters from the reaction products between pivalic acid, neodecanic acid or 2-ethylhexanic acid and tert.butylhydroperoxide, tert.amylhydroperoxide, cumyl hydroperoxide, 2,5-dimethyl-2,5-dihydroperoxyhexane and 1,3-di-(2-hydroxyperoxyisopropyl)benzene. Disuccinoyl peroxide is particularly suitable as an aqueous medium.

The decomposition temperature of the peroxide compounds can sometimes be reduced in an advantageous manner by adding coinitiators such as heavy-metal salts or tertiary amines.

N,N-diacyl-hydroxyl amines, O-alkylated N,N-diacylhydroxylamines and/or O-acylated N,N-diacylhydroxylamines which belong to another group of thermal initiators are indicated by the general formulas 1, 2 and 3.

N,N-diacylhydroxylamine:

  (1)

O-alkylated N,N-diacylhydroxylamine:

  (2)

O-acylated N,N-diacylhydroxylamine:

  (3)

R, R', R", and R'" mean the same or different organic substituents that are especially selected from the group of aliphatic, linear, branched and/or cyclic substituted and/or unsubstituted hydrocarbons. R, R', and R'" can also be aromatic hydrocarbons such as a phenyl residue.

Preferably, R, R', R", and/or R'" comprise hydrocarbon chains with a chain length of 2–18 atoms. The hydrocarbon chains may also be interrupted by heteroatoms from the group N, O and/or S. For example, R, R', R", and R'" can be derived from natural fatty acids.

In a preferred embodiment of the present invention, the residues R and/or R' close to form a chain with a length of 2–10 atoms.

In another preferred embodiment of the invention, the two residues R and R' form a closed ring system, whereby the N,N-diacylhydroxylamines group is bound via the acyl groups to the ring system. The ring system contains a benzene ring, naphthalene or anthracene, for example.

In the case of N,N-diacylhydroxylamine, O-alkylated N,N-diacylhydroxylamines and/or O-acylated N,N-diacylhydroxylamines, the initiator system preferably contains a coinitiator that contains metal ions. The preferred metal ions are derived from metals having at least two oxidation states ranging from I to VIII, for example the transition metals Ti, V, Cr, Mo, W, Mn, Fe, Co, Rh, Ir, Ni, Rh, Ir, Pd, Pt and/or Cu. Particularly preferred are cobalt ions with oxidation states of II or III, possibly with other metal ions. The ions of alkali or alkaline earth metals such as Li, K, Ca, Sr, Ba, and Bi, Pb, Zn, Cu, Zr and/or Ce can be contained as additional metal ions of the coinitiator that improve the effect of the coinitiator.

The amount of the thermal initiator system in the paint is preferably 0.1 to 7 percent by weight.

In the combined initiators system, there are UV initiators in addition to the thermal initiators. Among the suitable photoinitiators, the derivatives of benzoin, benzophenone, thioxanthone, anthroquinone, acylphosphine oxide, or acetopheonone. 1-hydroxy-cyclohexyl-phenyl ketone and/or diphenyl (2,4,6,trimethobenzoyl) phosphine oxide are especially preferred. The quantity of UV initiators in the paint preferably ranges from 0.5 to 7 percent by weight.

The ratio of the two initiator systems in the combined initiator according to the invention ranges from 0.1:1 to 10:1 and is typically close to 1.

In a preferred embodiment of the present invention, the thermal and UV initiators systems are formed by the same class of compounds. This is true especially for azo compounds.

As a hardenable component, the paint includes binders with ethylenically unsaturated groups. Among the preferred ethylenically unsaturated groups or monomers are especially (meth)acrylates, vinyl esters, vinyl ethers, acrylamides, vinyl chloride, acrylonitrile, butadiene, unsaturated fatty acids, styrene derivatives, maleic acid or fumaric acid groups. Typical oligomer representatives that bear these reactive groups are polyesters, polyurethanes, alkyd resins, peroxides, polyethers or polyolefins. Particularly preferred are multiple (meth)acrylate-substituted monomers and oligomers.

10 to 99 percent by weight of the binders or prepolymers are preferably formed by acrylate compounds.

The required reactivity of the paint is essentially attained by reactive oligomers. According to the invention, these include polyfunctional acrylate-modified isocyanurates obtainable by reacting a pentaerythritol derivative of formula (4) with an isocyanurate residue of general formulas (5).

The addition compounds of both reactants (4) and (5) are formed by a condensation reaction between the free hydroxyl group(s) of the compound of formula (4) and the isocyano groups of the compound of formula (5).

General formula of the pentaerythritol derivative:

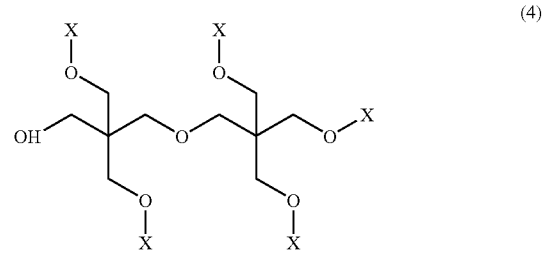  (4)

where X=—CO—CH=CH$_2$ or —C$_n$H$_m$ or —CO—C$_n$H$_m$, whereby —C$_n$H$_m$ is an aliphatic group with 1 to 3 C atoms, whereby 0, 1, 2 or 3 X substituents are formed by —C$_n$H$_m$ or —CO—C$_n$H$_m$.

In a particularly preferred embodiment, all X substituents are simultaneously formed by —CO—CH=CH$_2$. The resulting compound is also termed dipentaerythritol pentaacrylate.

The general formula of the isocyanurate residue is:

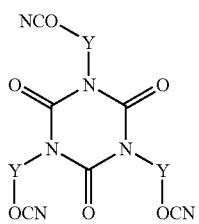

(5)

Y is an organic molecular chain with a length of 3 to 8 atoms with the organic molecular chain of Y having at least 3 C atoms (carbon atoms), and other hetero atoms that may be present are formed by N, O, and/or S. In a preferred embodiment, the molecular chain Y is an aliphatic residue; it is particularly preferable for the molecular chain to consist of 6 methylene groups.

The organic molecular chain Y can also bear additional reactive groups, especially from the class of isocyanates and/or acrylates and/or methacrylates.

In addition to their greater reactivity, another advantage of the reactive oligomers according to the invention is their low polymerization shrinkage. This is probably an effect of the high molecular weight coupled with the high functionality.

The three Y substituents of a central 2,4,6-oxo-1,3,5-triazine unit (also termed isocyanurate) can be different from each other. Likewise, mixtures of different addition compounds from (4) and (5) are suitable as reactive oligomers.

In another embodiment of the present invention, the paint also includes a reactive monomer consisting of dipentaerythritol hexacrylate, whereby the molecular ratio of the addition compound to the dipentaerythritol ranges from 0.5 to 1.5 and is preferably 1.

The preferred amount of reactive oligomers ranges from 5–55 percent by weight of the paint, and it is particularly preferable for it to be 20 to 40 percent by weight.

The paint containing addition compounds from (4) and (5) has at least one of the described thermal initiator systems. An advantage of this variety of paint with a large amount of reactive oligomers is that UV curing can also be dispensed with. It is also possible to completely cure the paint under air.

Additional components that the paints can contain are high-molecular compounds (prepolymers) that can be polymerized. Among the preferred prepolymers are di, tri, tetra, or hexa-functional urethane acrylates that are synthesized by reacting (poly)isocyanates with hydroxyalkyl(meth)acrylates. A distinction is drawn between aliphatic and aromatic urethane acrylates depending on the type of utilized isocyanate. Among the aromatic types, primarily toluylene diisocyanate (TDI) or diphenyl methane diisocyanate (MDI) are used. Particularly suitable as aliphatic isocyanates are especially isophorone diisocyanate (IPDI) or hexamethylene diisocyanate (HDI) as well as its higher polymers (biuret, isocyanurates etc.).

Solid fillers (loading agents) can be added to the paint to further improve the mechanical properties. Organic polymers or inorganic substances are suitable as fillers. In particular, polyacrylates, polymethacrylates or glasses are suitable. Particularly preferred fillers are the polymer products of the monomers of the binders used in the corresponding paint formulation. The fillers are normally very fine powders with an average particle size below 5 μm or nanopowders.

Additional components that the paint can contain are UV stabilizers that reduce the familiar damage to polymers from intense sunlight or UV light. This is particularly important when the paint is used for automobiles since the paint should be weather-resistant and suitable for outdoor use. The UV stabilizers are normally formed by UV absorbers that absorb UV light in the cured paint and emit it at longer wavelengths. The absorption range is preferably 200 to 400 nm. According to the invention, absorbers are used that are based on particular on benzophenones, alphahydroxybenzophenones, benzotriazoles, alphahydroxybenzotriazoles, benzoates, oxanilides or salicylates. The preferred amount of absorbers ranges from 0.5 to 5 percent by weight.

Organic solvents at amounts of 1 to 50 percent by weight may be present as additional components of the paint. Particularly preferred solvents include xylene and/or butyl acetate.

Another aspect of the present invention concerns preferred methods for curing the layers of these paints.

Paint layers are understood to be coatings that are a few μm to a few hundred μm thick.

A feature of the method according to the present invention for curing a paint layer with binders that bear ethylenically unsaturated groups is that the curing reaction is at least started as thermal radical polymerization with access to air. The curing of the paint layer includes two process steps of which at least the first is thermally-initiated radical polymerization with access to air, and the second process is thermally-induced, UV-induced or radiation-induced radical polymerization that is either carried out with access to air or under a protective gas.

In a first variation of the process according to the present invention, the entire curing process is performed as thermal radical polymerization with access to air. The paint forming the paint layer preferably also contains additional binders that are reactive oligomers from the addition compounds from (4) and (5) and/or a combination of reactive thermal initiators from the group of azo compounds and N,N-diacyl hydroxyl amines, O-alkylated N,N-diacyl hydroxyl amines and/or O-acylated N,N-diacyl hydroxyl amines. It is particularly preferable for the share of reactive oligomers to be above 15 percent by weight of the entire amount of radically polymerizable components. A particular advantage of this variation of the method is that no protective gas is required to completely cure the paint layer. "Completely cure" is understood to mean that no tacky surface layer or soft layers remain. However, it is possible that that the paint layer may have a greater final hardness under different process conditions.

In a second variation of the process according to the present invention, there are two process steps. The first process step is thermal curing under air, and the second process step is thermal curing under protective gas. The conditions for the protective gas can be, for example, gasification with $N_2$, Ar, or $CO_2$. According to the invention, reactive thermal initiator systems are used that can include N,N-diacyl hydroxyl amines, O-alkylated N,N-diacyl hydroxyl amines and/or O-acylated N,N-diacyl hydroxyl amines. The binders with ethylenically unsaturated groups can also be free of the reactive oligomers of the addition compounds from (4) and (5).

An advantage of this two-step procedure with a first step involving exposure to air is that only the base coat of the paint is first cured, while the surface layer exposed to air remains viscous or soft. This is probably a consequence of the curing being inhibited by atmospheric oxygen that can pass over the paint surface. This uncured surface layer can easily conform to the curing-related shrinking of the layers underneath. Under subsequently created inert gas conditions, the surface layer is completely cured. With this procedure, particularly smooth and flawless paint surfaces can be created, i.e., especially with minimal pinholes or blisters.

A third variation of the process according to the present invention also provides for two process steps, with the first being exposure to air and the second being under inert gas. The curing in the second step is not thermal but rather UV or radiation curing. In this variation as well, reactive thermal initiators are used in the first process step as already discussed. In addition, there are photoinitiators in the paint layer. These variations of the process also produce very smooth and flawless paint surfaces for the above-described reasons.

In a preferred embodiment of these process variations, the initiator includes at least two different azo compounds and N,N-diacyl hydroxyl amines, O-alkylated N,N-diacyl hydroxyl amines and/or O-acylated N,N-diacyl hydroxyl amines. The photoinitiator is formed by one of the azo compounds.

In the variation of the process with the combined initiator system and combined starting mechanism of thermal and UV curing, one observes that the final hardness of the paint is slightly lower in shaded areas of the painted components than in the areas exposed to UV light. For most applications, it is not necessary to have paint that has reached the maximum attainable final hardness; paint that is solid to the touch is sufficient. This illustrates one of the particularly preferred applications of the paint according to the present invention and the curing process according to the present invention in automobile manufacturing, where liquid paint is sprayed on a finished component in a conventional painting process. The spray mist is also deposited on all areas of the component that are subsequently no longer visible and are no longer accessible to light. Nevertheless, the paints must harden in these areas until they are no longer tacky and permanently adhere to the component. It is not necessary for the paint to attain the theoretical maximum final hardness.

Even with these variations of the process, it is advantageous to use reactive oligomers in quantities above 15 percent by weight of all radically polymerizable components.

In the combined process variations, the process steps of thermal polymerization and photoinitiated polymerization can also overlap for different lengths of time.

The listed process variations can also be carried out completely under protective gas without a process step involving exposure to air to achieve complete hardness. However, the cited advantages of the method according to the present invention are foregone.

The illumination method for curing the coating solution preferably involves irradiation with UV light. The optimum wavelength of the UV light or utilized radiation sources depends on the photoinitiators selected and is known. Irradiation with electron beams can also be used for curing.

The method according to the present invention and the paint are particularly useful for producing topcoats in multilayer paint systems. In particular, they are suitable for creating a clearcoat. For example, the paint can be used as a clearcoat or topcoat for automobiles. The topcoat can be on a primer, a pigment coat or on an essentially untreated substrate.

Likewise, the paint can be used in a multilayer paint system employing a wet-in-wet method. Preferably, the base coat, shaded areas of the clearcoat and bottom clearcoat layer are simultaneously heat-cured.

In another preferred use, the paints according to the present invention with the reactive oligomers are used as binders, especially in adhesives, resins, dental materials, modeling compounds or fillers. Using the paint systems as binders has the advantage of a greater tolerance against exposure to atmospheric oxygen and comparatively low starting temperatures for thermal curing. In particular, when they are used as dental and modeling materials, the higher surface quality of the cured materials is advantageous.

BRIEF DESCRIPTION OF THE DRAWINGS

FIG. 1 illustrates one method of the present invention.

DETAILED DESCRIPTION OF AN EMBODIMENT

FIG. 1 schematically illustrates one embodiment of the method present invention in which paint 10 is applied on a metal substrate by spraying 20. The paint is then thermally cured under air at step 30. Radiation with UV light cures the paint in the second step at step 40. No protective gas need be used, with polymerization occurring under air.

Examples are presented in the following to illustrate the present invention. They only serve to further explain the invention and in no way limit the object of the present invention.

EXAMPLE 1

To produce a cured paint layer, a paint with the following composition was used as the base:

Thermal initiators:
2,2'-azobis(4-methoxy-2,4-dimethyl valeronitrile): 2 percent by weight
N,N-diacyl hydroxyl amine: 0.5 percent by weight
Cobalt (II) salt: 0.05 percent by weight
Binder with ethylenically unsaturated groups:
Mixture of hexafunctional aliphatic urethane acrylate, trifunctional aliphatic urethane acrylate, difunctional aliphatic urethane acrylate and polyether tetraacrylate: 3 percent by weight
Dipentaerythritol hexaacrylate: 20 percent by weight
Reactive oligomer consisting of dipentaerythritol pentaacrylate (obtainable by reacting a pentaerythritol derivative of formula (4) with an isocyanurate residue of general formula (5), whereby all X substituents can simultaneously be formed by $-CO-CH=CH_2$): 20 percent by weight
UV absorber and radical interceptor (HALS): 1 percent by weight
Butyl acetate solvent: remainder up to 100 percent by weight This paint was applied using doctor blades on a metallic substrate at a thickness of a few μm. This was followed by single-step curing. The entire curing process consisted of thermal radical polymerization under exposure to air. The curing temperature was 130° C., and curing lasted for 20 minutes.

The applied paint was completely hardened into a solid paint layer.

EXAMPLE 2

The following paint composition was created in another exemplary embodiment:
Thermal initiator:
Dimethyl 2,2-azobisisobutyrate: 2 percent by weight
Binder with ethylenically unsaturated groups:
Mixture of hexafunctional aliphatic urethane acrylate, trifunctional aliphatic urethane acrylate, difunctional aliphatic urethane acrylate, and polyether tetraacrylate: 60 percent by weight
  UV absorber and radical interceptor (HALS): 1 percent by weight
  Butyl acetate solvent: remainder up to 100 percent by weight This paint was sprayed on a metallic substrate at a thickness of a few μm.

The curing occurred in two process steps. The first process step consisted of thermal curing under air. The selected process conditions were a temperature of 100° C. and curing time of 10 minutes.

The second process step consisted of thermal curing under protective gas. The curing temperature was 100°, and the curing time was 10 minutes. The protective gas conditions were gasification with $N_2$.

The cured paint layers created in this manner were particularly smooth and flawless paint surfaces that had only minimal pinholes or blisters.

EXAMPLE 3

In another exemplary embodiment, the following paint composition was selected.
Thermal initiator 1:
N,N-diacyl hydroxyl amine: 0.5 percent by weight
Cobalt (II) salt: 0.05 percent by weight
  UV initiator (photoinitiator):
Dimethyl-2,2'-azobisisobutyrate: 1 percent by weight
  Binder with ethylenically unsaturated groups:
Mixture of hexafunctional aliphatic urethane acrylate, trifunctional aliphatic urethane acrylate, difunctional aliphatic urethane acrylate and polyether tetraacrylate: 40 percent by weight
Dipentaerythritol hexaacrylate: 20 percent by weight
  Reactive oligomer consisting of dipentaerythritol pentaacrylate (obtainable by reacting a pentaerythritol derivative of formula (4) with an isocyanurate residue of general formula (5), whereby all X substituents can simultaneously be formed by —CO—CH=$CH_2$): 20 percent by weight
  UV absorber and radical interceptor (HALS): 1 percent by weight
  Butyl acetate solvent: remainder up to 100 percent by weight The paint was applied on a metal substrate at a thickness of a few μm. Spraying was selected as the painting process.

Two process steps were used for curing. The first process step comprised thermal curing under air (100° C. for 10 minutes), and the second process step comprised curing under protective gas. The curing in the second step was not started by heat; radiation-induced curing was used. A UV emitter was used for radiation. The protective gas conditions of the second step were gasification with $N_2$.

The paint was cured into a hard paint layer using the chosen curing process. The paint layer had different areas of final hardness. In the areas shaded from the UV radiation, the final hardness was somewhat lower than in the areas exposed to UV light.

EXAMPLE 4

In another exemplary embodiment, the following paint composition was selected:
Thermal initiator:
N,N-diacyl hydroxyl amine: 0.5 percent by weight
Cobalt salt: 0.2 percent by weight
  UV initiator and/or thermal initiator:
Dimethyl-2,2'-azobisisobutyrate: 1.5 percent by weight
2,2'-azobis (4-methoxy-2,4-dimethylvaleronitrile): 1 percent by weight
  Binder with ethylenically unsaturated groups:
Mixture of hexafunctional aliphatic urethane acrylate, trifunctional aliphatic urethane acrylate, difunctional aliphatic urethane acrylate and polyether tetraacrylate: 40 percent by weight
Dipentaerythritol hexaacrylate: 20 percent by weight
  Reactive oligomer consisting of dipentaerythritol pentaacrylate (obtainable by reacting a pentaerythritol derivative of formula (4) with an isocyanurate residue of general formula (5), whereby all X substituents can simultaneously be formed by —CO—CH=$CH_2$): 20 percent by weight
  UV absorber and radical interceptor (HALS): 1 percent by weight
  Butyl acetate solvent: remainder up to 100 percent by weight The paint was applied on a metal substrate at a thickness of a few μm. The selected painting method was spraying.

Two process steps were used for curing. The first process step was thermal curing under air (100° C., 10 minutes). Radiation with UV light was used for curing in the second step. No protective gas was used, and polymerization occurred under air.

This curing process also produced a hard paint layer; in particular, there were no areas with a tacky surface.

What is claimed is:
1. A paint with binders having ethylenically-unsaturated groups, the paint capable of being hardened exclusively under heat or by a combination of radical polymerization initiated by heat and radical polymerization initiated by UV light or high-energy radiation, the paint comprising:
  a thermal or combined initiator system including thermal initiators and UV initiators and reactive oligomers, whereby the oligomers include addition compounds of a first reactant of the formula:

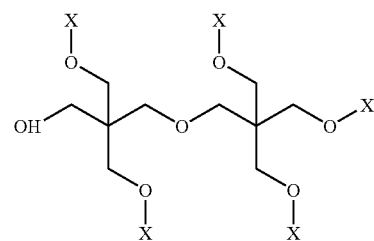

where X =—CO—CH=$CH_2$ or —$C_nH_m$ or —CO—$C_nH_m$, whereby —$C_nH_m$ is an aliphatic residue with 1 to 3 C atoms, whereby 0, 1, 2 or 3 X substituents are formed by —$C_nH_m$ or —CO—$C_nH_m$, and a second reactant of the formula:

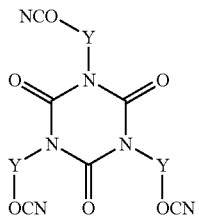

where Y is a hydrocarbon chain of 3 to 8 atoms, whereby the hydrocarbon chain can also contain heteroatoms.

2. The paint as recited in claim 1 wherein the thermal initiator system is formed by azo compounds.

3. The paint as recited in claim 2 wherein the azo compounds include azonitriles, cyclic or non-cyclic azoamides, azocumol or azocarboxylic acid esters, benzopinacol silyl ethers, N,N-diacyl hydroxyl amines, O-alkylated N,N-diacyl hydroxyl amines and/or O-acylated N,N-diacyl hydroxyl amines.

4. The paint as recited in claim 1 wherein the thermal initiator system comprises N,N-diacyl hydroxyl amines, O-alkylated N,N-diacyl hydroxyl amines and/or -acylated N,N-diacyl hydroxyl amines as well as coinitiator.

5. The paint as recited in claim 4 wherein the coinitiators include metal ions selected from the group of Ti, V, Cr, Mo, W, Mn, Fe, Co, Rh, Ir, Ni, Pd, Pt and/or Cu.

6. The paint as recited in claim 1 wherein the UV initiator system includes benzoin, benzophenone, thioxanthone, anthroquinone, acylphosphine oxide, acetopheonone, aromatic phosphine oxides and/or azo compounds.

7. The paint as recited in claim 1 wherein an addition compound consisting of the first and second reactants forms a majority of the binders with ethylenically unsaturated groups.

8. A method to cure a paint with binders having ethylenically unsaturated groups so as to from a paint coat, the method comprising:

curing the paint by thermally-initiated radical polymerization or a combination of thermally-initiated and UV-light initiated radical polymerization under air, or by thermally-initiated radical polymerization under protective gas, wherein the binders having the ethylenically unsaturated groups also have reactive oligomers formed by addition compounds from a first reactant of the formula:.

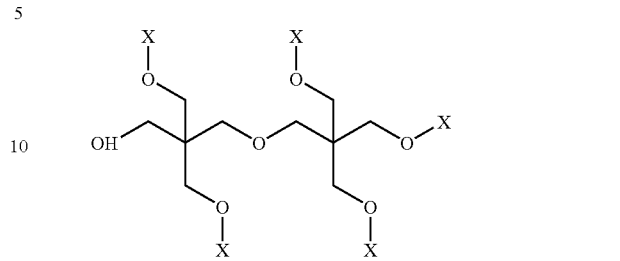

where X=—CO—CH=CH2 or —CnHm or —CO—CnHm, whereby —CnHm is an aliphatic residue with 1 to 3 C atoms, whereby 0, 1, 2 or 3 X substituents are formed by —CnHm or —CO—CnHm, 2 and a second reactant of the formula:

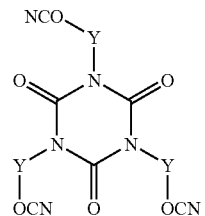

where Y is a hydrocarbon chain of 3 to 8 atoms, and the hydrocarbon chain can also contain heteroatoms.

9. The method as recited in claim 8 wherein the curing includes two process steps including a first step of thermally initiating radical polymerization under air, and second step includes thermal or ultraviolet or radiation-induced radical polymerization either carried out with access to air or under a protective gas, the paint including reactive thermal initiators from the group of azo compounds, N-diacyl hydroxyl amines, O-alkylated N,N-diacyl hydroxyl amines and/or O-acylated N,N-diacyl hydroxyl amines.

10. The method as recited in claim 8 wherein the ultraviolet-light initiators include azo compounds.

* * * * *